United States Patent [19]

Lianjun et al.

[11] Patent Number: 5,582,679
[45] Date of Patent: Dec. 10, 1996

[54] ENHANCED METAL ETCH PROCESS

[75] Inventors: Liu Lianjun; Ron-Fu Chu, both of Singapore, Singapore

[73] Assignee: Chartered Semiconductor Manufacturing Pte Ltd., Singapore, Singapore

[21] Appl. No.: 304,684

[22] Filed: Sep. 12, 1994

[51] Int. Cl.[6] .................................................. H01L 21/336
[52] U.S. Cl. ..................... 156/651.1; 156/646.1; 216/77
[58] Field of Search ............................. 216/102, 64, 77; 156/643.1, 646.1, 651.1

[56] References Cited

U.S. PATENT DOCUMENTS

| | | | |
|---|---|---|---|
| 4,505,782 | 3/1985 | Jacob et al. | 156/643 |
| 4,592,800 | 6/1986 | Landau et al. | 156/643 |
| 4,863,561 | 9/1989 | Freeman et al. | 156/646 |
| 5,211,804 | 5/1993 | Kobayashi | 156/665 |
| 5,350,488 | 9/1994 | Webb | 156/646 |
| 5,397,433 | 3/1995 | Gabriel | 156/665 |

OTHER PUBLICATIONS

"Tapered Aluminum Interconnect Etch"; Allen et al., J. Vac. Sci; 12 (4, Pt. 1); pp. 1265–1268; Aug. 1994.
"Electron Cyclotron Resonance Etching of Aluminum Alloys With Boron Trichloride–Chlorine–Nitrogen", Marx et al.; 1992; J. Vac. Sci. Techn. 10(4, Pt. 1); pp. 1232–1237.

*Primary Examiner*—R. Bruce Breneman
*Assistant Examiner*—George Goudreau
*Attorney, Agent, or Firm*—George O. Saile

[57] ABSTRACT

A method for dry etching metal films, specifically aluminum, is described. This process uses photoresist as a mask with a gas mixture of BCl3, Cl2 and N2 used for the RIE. The addition of specific amounts of N2 to the etching chemistry results in non-tapered or non-undercut aluminum shapes. These desired shapes are attributed to the creation of polymer on the sidewall of the aluminum during the etching procedure, thus protecting against the isotropic components of RIE process, which cause the tapering. This RIE process can also be conducted at high enough temperatures, needed to avoid deleterious microloading effects.

18 Claims, 3 Drawing Sheets

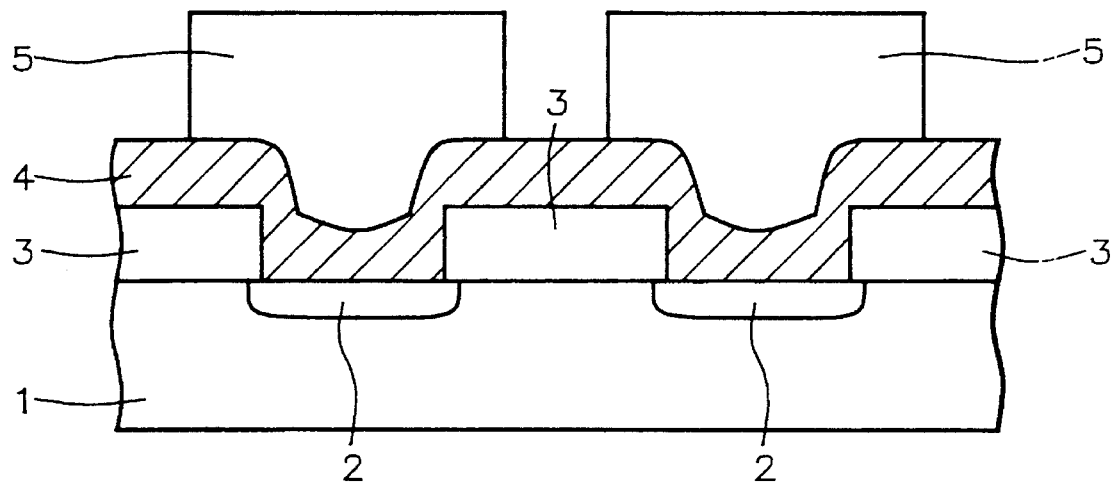
FIG. 3
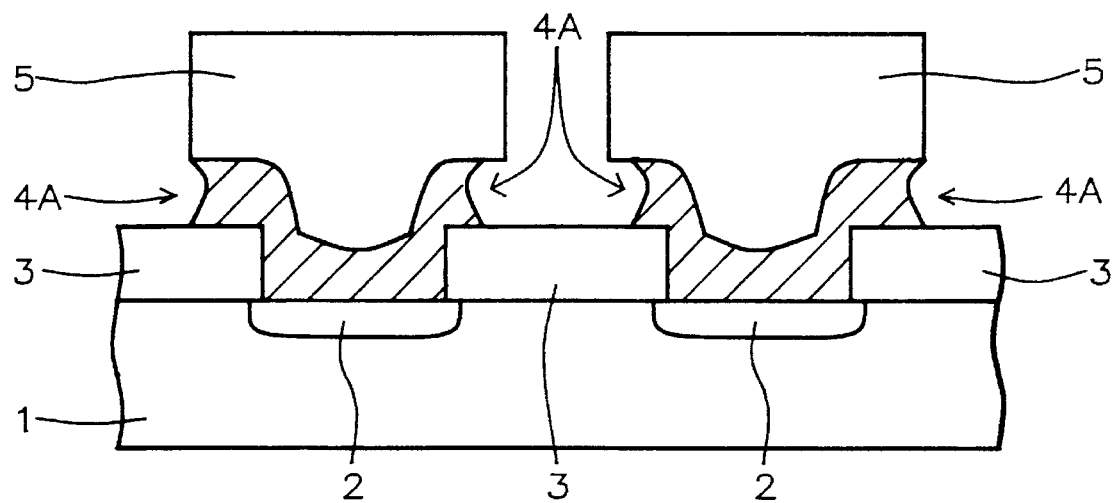
FIG. 4 – Prior Art 5,582,679

1

ENHANCED METAL ETCH PROCESS

BACKGROUND OF THE INVENTION (1) Field of the Invention

The present invention relates to a fabrication technique for semiconductor integrated circuits, and more specifically to dry etching of aluminum films, used as part the integrated circuits.

(2) Description of Prior Art

Very large scale integration, (VLSI), has allowed the semiconductor chip industry to reduce cost by increasing chip density, (circuits per chip), while still maintaining reliability. The major factor in increasing chip densities has been the ability of the industry to drastically reduce the image size of specific chip features. Advances in lithography, via use of more advanced cameras, as well as the development of more sensitive photoresist materials, have led the way for microminiturazation. However forming the smaller image pattern in the photoresist still leaves the process engineer with the situation of producing this small image on the semiconductor. One such area where difficulty can arise is the transfer of this small image in photoresist, to an underlying aluminum layer, on the semiconductor.

The use of reactive ion etching, (RIE), has allowed the industry to successfully transfer small images in photoresist, to underlying metal layers. A major advantage of RIE processing is the anisotropic component of this etching technique. The low pressures associated with RIE drastically reduces most isotropic aspects, and therefore allows a less tapered or less undercut profile to be obtained. However the use of RIE also demands that a high selectivity exist between the material being patterned, aluminum in this case, and the underlying material, silicon dioxide in this case. It is also desirable that the removal rate of the masking photoresist be much smaller then the removal rate of aluminum. Therefore the chemistry used with RIE processing has to be carefully selected and developed to successfully produce the images needed with VLSI technologies. One solution, U.S. Pat. No. 5,211,804 by Kobayashi, explains how a specific RIE process achieves metal shapes without much tapering or undercut and also without degradation, or too much removal of the underlying material, silicon dioxide. This is accomplished using a BCl3, Cl2, and O2 chemistry. However in this case the masking or patterning material was not photoresist, but silicon dioxide. (The image was initially formed in silicon dioxide using photoresist as the mask, followed by removal of the photoresist). The use of O2 is critical to this invention for without it the desired characteristics would not have been achieved. However the use of O2 as part of the RIE chemistry demanded the use of an non-organic masking film, silicon dioxide, and all the additional processing and cost associated with the additional steps.

The purpose of this invention is to achieve the desired profile in aluminum, without undercut or tapering, and with a chemistry that exhibits the desired selectivity between aluminum and the masking and underlying materials, using the less expensive process, direct photoresist masking. Therefore a RIE process, without O2 as one of its components, was invented.

SUMMARY OF THE INVENTION

It is an object of this invention to provide a method for the reactive ion etching, (RIE), of metal films, using photoresist as a mask, to be used in the manufacturing of semiconductor integrated circuits.

It is another object of this invention to provide a method of reactive ion etching of metal films, containing alumunium, with non-tapered profile, or without undercut in regards to the overlying masking material.

It is still another subject of this invention to provide a method of reactive ion etching of metal films which microloading effects are reduced.

In accordance with this present invention, a method is described for reactive ion etching of aluminum comprising the steps of: depositing the aluminum film on a semiconductor substrate, which has the desired patterning needed to form the required circuit design; using standard photolithographic processing to form the desired pattern in the overlying photoresist; using reactive ion etching to transfer the desired pattern in the photoresist to the underlying aluminum film via the use of a RIE etching mixture of BCl3, Cl2, and N2; and using standard processing to remove the masking photoresist and the polymer formed the sidewall of the etched aluminum.

BRIEF DESCRIPTION OF THE DRAWINGS

The object and other advantages of this invention are best explained in the preferred embodiment with reference to the attached drawing that include:

FIGS. 1–3 schematically illustrate the cross-section representation of the fabrication steps and stages prior to the RIE of aluminum.

FIG. 4 represents the result of a RIE process without the use of N2 as part of the etching gas mixture.

DESCRIPTION OF THE PREFERRED EMBODIMENTS

The method for obtaining non-tapered aluminum patterns on a semiconductor substrate, using an enhanced reactive ion etching, (RIE), process, is now described detail.

Figure 1:
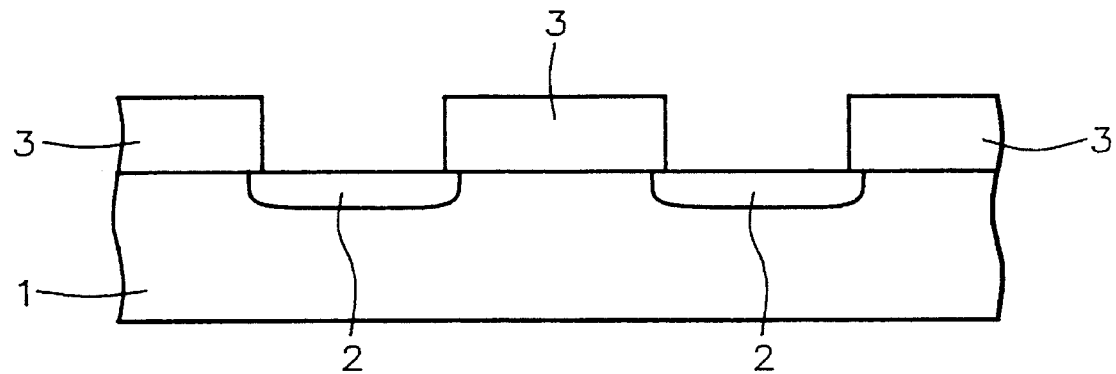
Figure 2:
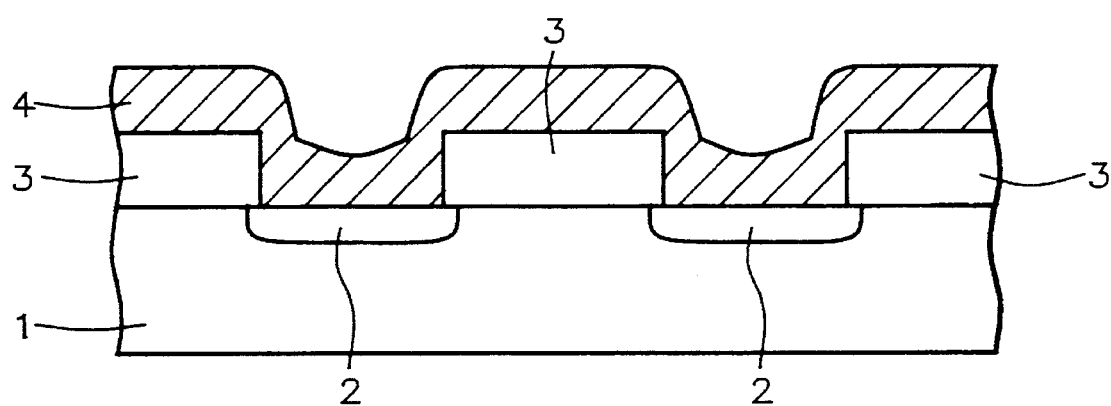

FIGS. 1–3 briefly illustrates the key stages and steps used in the fabrication sequence of a semiconductor device, up to the point where the RIE etching of aluminum is to occur. In FIG. 1, a silicon substrate, 1, with active device regions, 2, to be subsequently contacted by aluminum, is shown. The active device regions, 2, were formed by patterning a silicon dioxide film to obtain silicon dioxide islands, 3. These islands in turn, were used as a mask to form the active device regions, 2.

Next an aluminum film, 4, shown in FIG. 2 is deposited using sputtering at a pressure of 1 to 4 mTorr., and to a thickness of about 5,000 to 10,000 Angsttoms. The aluminum may contain between about 0.8 to 1.5% copper, and between about 0.5 to 1.0% silicon. The aluminum film covers the exposed active device regions, 2, in the silicon as well as the silicon dioxide islands, 3. FIG. 3 shows the result of standard photolithographic processing, used to obtain the desired pattern, 5, in the organic photoresist. As a consequence the exposed regions of the aluminum film, not covered by the overlying photoresist image, 5, will be subsequently removed by the enhanced RIE process.

FIG. 4 schematically shows the result of a RIE process used to dry etch aluminum, using the pattern and structure previously shown in FIG. 3. The RIE process consisted of between about 15 to 30 sccm of BCl3, and between about 40 to 60 sccm of CL2, at a pressure of about 4 to 8 mTorr., and at a temperature of between about 40° to 90° C. It can be seen that the resulting aluminum pattern 4A, is tapered, and a severe undercut exists, in reference to the masking photoresist image, 5. The reason for the undercutting is believed to be a result of a lack significant polymer formation on the sidewalls of the etched aluminum, 4A, thus offering little or no protection from the isotropic components of this RIE process, during the etching procedure. The amount of undercut resulting, although not shown here, can vary significantly from dense to isolated patterns due to microloading effects. The microloading effect can be reduced by increasing the temperature of the etch to between about 60° to 90° C. However the increased temperature of the RIE process using BC13 and Cl2, although resulting in a reduction in microloading, (that is similar aluminum shapes in dense and isolated regions), still has the adverse effect of creating even greater undercut aluminum shapes in some chip locations. Again the severe undercut at elevated temperatures was a result of a lack of significant polymer on the sidewall of the aluminum shape during the RIE process.

Figure 5:
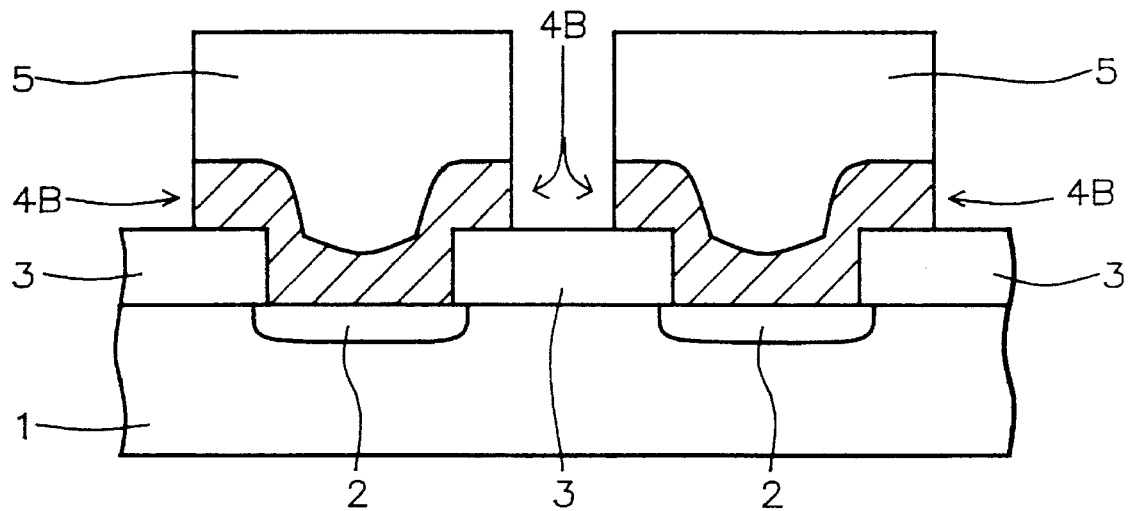
FIG. 5 schematically represents the result of a RIE process using N2 as part of the etching gas mixture.

Referring now to FIG. 5, the result of RIE processing, performed on the structure shown previously in FIG. 3, can be observed. Here the aluminum shape, 4B, was created using a RIE process that allowed for identical transfer of image from photoresist shape, 5, to aluminum shape, 4B. This was achieved by a RIE process using an etching chemistry of between about 15 to 30 sccm of BC13, between about 50 to 70 sccm of Cl2, and adding between about 10 to 30 sccm of N2, with the preferred amount being about 20 sccm. The etching was performed at a pressure of about 4 to 7 mTorr., ant at a temperature of between about 50° to 70° C. The introduction of N2, at least 10%, but not greater then 35% of the etching mixture, results in the creation of N2 containing polymer, on the sidewall of aluminum shape, 4B, during the RIE procedure. The N2 containing polymer now protects the sidewall of the aluminum shape, 4B, from the isotropic components of the dry etch process. In addition, the polymer allows for higher RIE temperatures to be used, thus reducing adverse microloading effects while still protecting against isotropic components.

Figure 6:
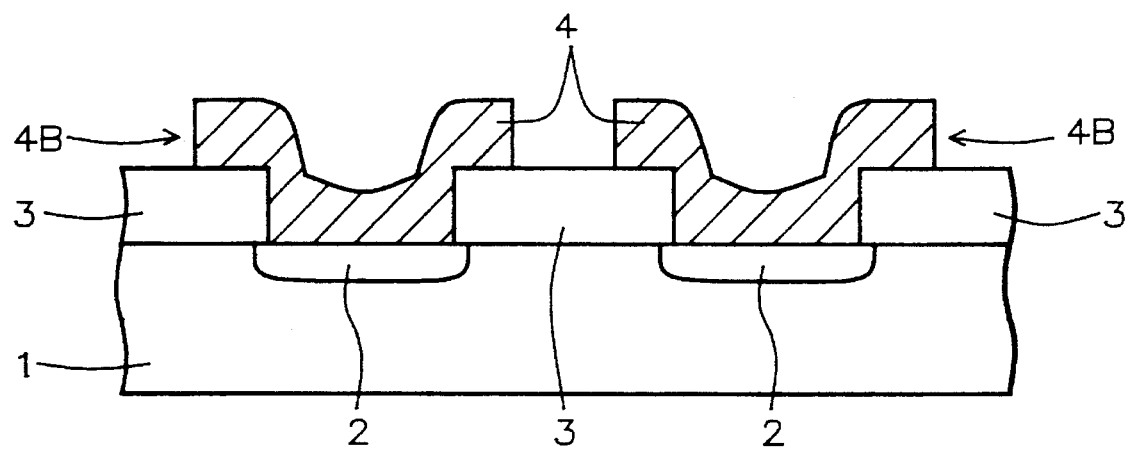
FIG. 6 schematically shows the final metal shape.

Finally a post RIE organic solvent is used, at a temperature between about 60° to 70° C., to remove the photoresist and the sidewall polymer. This is shown schematically in FIG. 6.

It should be noted that this invention, enhanced metal etch process, although not shown as part of any specific device application can be used for the fabrication of NFET, (n type field effect transistors), PFET, as well as for CMOS, (complimentary metal oxide silicon), and BiCMOS, (bipolar-CMOS), type devices.

While this invention has been particularly shown and described with reference to the preferred embodiments thereof, it will be understood by those skilled in the art that various changes in form and details may be made without departing from the spirit and scope of this invention.

What is claimed is:

1. A method for forming aluminum patterns on a semiconductor substrate comprising the steps of:

depositing a aluminum based layer on said substrate;

forming an organic photoresist image on part of said aluminum based layer;

anisotropically etching the exposed part of said aluminum based layer in a ambient comprised of between 15 to 30 sccm of BCl3, between 50 to 70 sccm of Cl$_2$, and between 10 to 30 sccm of N$_2$, at a pressure between 4 to 7 mTorr, and at a temperature between 50° to 70° C., to form a straight wall, aluminum based shape, from said aluminum based layer; and removal of said photoresist image, at a temperature between 60° to 70° C., in an organic solvent.

2. The method of claim 1, wherein said aluminum based layer is comprised of pure aluminum deposited via sputtering procedures, at a pressure between 1 to 4 mTorr, to a thickness between 5000 to 10000 Angstroms.

3. The method of claim 1, wherein said aluminum based layer is comprised of aluminum, containing between 0.8 to 1.5% copper, deposited via sputtering procedures, at a pressure between 1 to 4 mTorr, to a thickness between 5000 to 10000 Angstroms.

4. The method of claim 1, wherein said aluminum based layer is comprised of aluminum, containing between 0.5 to 1.0% silicon, deposited via sputtering procedures, at a pressure between 1 to 4 mTorr, to a thickness between 5000 to 10000 Angstroms.

5. The method of claim 1, wherein said aluminum based layer is comprised of aluminum, containing between 0.8 to 1.5% copper, and between 0.5 to 1.0% silicon, deposited via sputtering procedures, at a pressure between 1 to 4 mTorr, to a thickness between 5000 to 10000 Angstroms.

6. A method for forming aluminum patterns on a semiconductor substrate comprising the steps of:

depositing a aluminum based layer on said substrate;

forming an organic photoresist image on part of said aluminum based layer;

anisotropically etching the exposed part of said aluminum based layer, in an ambient comprised of between 15 to 30 sccm of BCl3, between 50 to 70 sccm of Cl$_2$, and between 10 to 30 sccm of N$_2$, at a pressure between 4 to 7 mTorr, and at a temperature between 50° to 70° C., to form straight wall, aluminum shape, from said aluminum based layer;

forming a N$_2$ containing polymer on the sides of said aluminum shape, during the anisotropic etching of said aluminum based layer, via the addition of between 10 to 30 sccm of N$_2$, to the etching ambient; and removal of said photoresist, and said N$_2$ containing polymer, at a temperature between 60° to 70° C., in an organic solvent.

7. The method of claim 1, wherein said anisotropic etching is performed using photoresist as a mask, with said photoresist mask, and any organic compounds, formed during said anisotropic etching, removed in organic solvents, at a temperature between 60° to 70° C., at the conclusion of said anisotropic etching procedure.

8. The method of claim 1, wherein said anisotropic etching, of said aluminum based layer, is performed at a temperature between 50° to 70° C., with a minimum of 50° C. needed to prevent microloading effects.

9. The method of claim 1, wherein said anisotropic etching is performed at a pressure between 4 to 7 mTorr, with a maximum pressure of 7 mTorr, to avoid isotropic etching of said aluminum based layer, undercutting said photoresist shape.

10. The method of claim 6, wherein said anisotropic etching, of said aluminum based layer, is performed at a pressure between 4 to 7 mTorr, with a maximum pressure of 7 mTorr, to avoid isotropic etching of said aluminum based layer, undercutting said photoresist mask.

11. The method of claim 6, wherein said aluminum based layer is comprised of pure aluminum, deposited via sputtering procedures, at a pressure between 1 to 4 mTorr, to a thickness between 5000 to 10000 Angstroms.

12. The method of claim 6, wherein said aluminum based layer is comprised of aluminum, containing between 0.8 to 1.5% copper, deposited via sputtering procedures, at a pressure between 1 to 4 mTorr, to a thickness between 5000 to 10000 Angstroms.

13. The method of claim 6, wherein said aluminum based layer is aluminum, containing between 0.5 to 1.0% silicon, deposited via sputtering procedures, at a pressure between 1 to 4 mTorr, to a thickness between 5000 to 10000 Angstroms.

14. The method of claim 6, wherein said aluminum based layer is comprised of aluminum, containing between 0.8 to 1.5% copper, and between 0.5 to 1.0% silicon, deposited via sputtering procedures, at a pressure between 1 to 4 mTorr, to a thickness between 5000 to 10000 Angstroms.

15. The method of claim 6 wherein the said etching mixture is between 15 to 30 sccm of BC13, between 50 to 70 sccm of C12, and between 10 to 30 sccm N2, where the amount of N2 is in excess of 10%, but less then 35%, of the etching mixture.

16. The method of claim 6, wherein said anisotropic etching of said aluminum based layer, is performed at a temperature between 50° to 70° C., with a minimum of 50° C. needed to prevent microloading effects.

17. The method of claim 6, wherein said anisotropic etching is performed using photoresist as a mask, with said photoresist mask, and said $N_2$ containing polymer, formed during said anisotropic etching, removed in an organic solvent, at a temperature between 60° to 70° C., at the conclusion of said anisotropic etching procedure.

18. The method of claim 6, wherein said aluminum profile is straight walled, without isotropic undercutting of overlying said photoresist shape.

* * * * *